US005710061A

United States Patent [19]
Cleeves

[11] Patent Number: 5,710,061
[45] Date of Patent: Jan. 20, 1998

[54] DISPOSABLE POST PROCESSING FOR SEMICONDUCTOR DEVICE FABRICATION

[75] Inventor: James M. Cleeves, Redwood City, Calif.

[73] Assignee: Cypress Semiconductor Corp., San Jose, Calif.

[21] Appl. No.: 515,675

[22] Filed: Aug. 17, 1995

Related U.S. Application Data

[62] Division of Ser. No. 179,615, Jan. 10, 1994, abandoned.

[51] Int. Cl.$^6$ .................................................. H01L 21/283
[52] U.S. Cl. ............................. 437/195; 437/228; 430/313
[58] Field of Search ........................... 437/180, 195, 437/203, 228 I, 228 OL, 228 ST, 228 W, 229; 156/636.1; 430/313, 314, 317

[56] References Cited

U.S. PATENT DOCUMENTS

| 4,997,790 | 3/1991 | Woo et al. | 437/195 |
| 5,063,169 | 11/1991 | De Bruin et al. | 437/192 |
| 5,068,207 | 11/1991 | Manocha et al. | 437/235 |
| 5,158,910 | 10/1992 | Cooper et al. | 437/195 |
| 5,187,121 | 2/1993 | Cote et al. | 437/195 |
| 5,219,787 | 6/1993 | Carey et al. | 437/187 |
| 5,270,236 | 12/1993 | Rosner | 437/48 |
| 5,275,973 | 1/1994 | Gelatos | 437/195 |
| 5,283,208 | 2/1994 | Lorsung et al. | 437/195 |
| 5,319,247 | 6/1994 | Matsuura | 257/760 |
| 5,352,630 | 10/1994 | Kim et al. | 437/195 |
| 5,382,545 | 1/1995 | Hong | 437/195 |
| 5,461,004 | 10/1995 | Kim | 437/195 |

OTHER PUBLICATIONS

S. Wolf, "Silicon Processing for the VLSI Era" vol. II, pp. 161,238,429,432, Jun. 1990.

Fukase, et al, "A Margin–Free Contact Process Using An Al$_2$O$_3$ Etch–Stop Layer For Higher Density Devices," *IEDM*, Apr. 1992, pp. 837–840.

Ueno, et al, "A Quarter–Micron Planarized Interconnection Technology With Self–Aligned Plug," *IEDM*, Apr. 1992, pp. 305–308.

Kusters, et al, "A High Density 4Mbit dRAM Process Using a Fully Overlapping Bitline Contact (FoBIC) Trench Cell," *1987 Symposium on VLSI Technology Digest of Technical Papers*, May 18–21, 1987/Karuizawa, pp. 93–94.

Kakumu, et al, "PASPAC (Planarized Al/Silicide/Poly Si With Self Aligned Contact) With Low Contact Resistance and High Reliability in CMOS LSIs," *1987 Symposium on VLSI Technology Digest of Technical Papers*, May 18–21, 1987/Karuizawa, pp. 77–78.

Kenny, et al, "A Buried–Plate Trench Cell for a 64–Mb DRAM," *1992 Symposium on VLSI Technology Digest of Technical Papers*, Apr. 1992, pp. 14–15.

Subbanna, et al, "A Novel Borderless Contact/Interconnect Technology Using Aluminum Oxide Etch Stop for High Performance SRAM and Logic," Dec. 1993, pp. 441–444.

Kusters, et al, "A Stacked Capacitor Cell with A Fully Self–Aligned Contact Process for High–Density Dynamic Random Access Memories," *Journal of the Electrochemical Society*, vol. 139, No. 8, Aug. 1992, pp. 2318–2321.

"Method for Forming Via Hole Formation," *IBM Technical Disclosure Bulletin*, vol. 34, No. 10A, Mar. 1992, pp. 219–220.

(List continued on next page.)

*Primary Examiner*—Charles L. Bowers, Jr.
*Assistant Examiner*—Leon Radomsky
*Attorney, Agent, or Firm*—Blakely, Sokoloff, Taylor & Zafman LLP

[57] ABSTRACT

A disposable post process allows openings to be created in a layer formed over a semiconductor wafer, for example to create self-aligned contacts. A layer of material is formed over a semiconductor wafer and subsequently patterned into posts which define the location and shape of openings to be formed in a subsequently formed planar layer. After the planar layer is formed to surround the posts, the posts are removed to create openings in the planar layer. These openings may then be used to form suitable contacts.

20 Claims, 8 Drawing Sheets

OTHER PUBLICATIONS

"Self–Aligned, Borderless Polysilicon Contacts Using Polysilicon Pillars," *IBM Technical Disclosure Bulletin*, vol. 35, No. 2, Jul. 1992, pp. 480–483.

Wolf, et al, "Silicon Processing for the VLSI Era, vol. I: Process Technology," *Lithography I: Optical Resist Materials and process Technology*, 1986, pp. 453–454.

S. Wolf, "Silicon Processing for the VLSI Era, vol. 2: Process Integration," *Multilevel–Interconnect Tehnology for VLSI & ULSI*, 1992, pp. 222–237.

DISPOSABLE POST PROCESSING FOR SEMICONDUCTOR DEVICE FABRICATION

This is a divisional of application Ser. No. 08/179,615, filed Jan. 10, 1994, abandoned.

BACKGROUND OF THE INVENTION

1. Field of the Invention

The present invention relates generally to the field of semiconductor device fabrication and more particularly to the field of forming openings in a layer for semiconductor device fabrication.

2. Description of the Related Art

Typically in semiconductor device fabrication processes, contact openings are created in dielectric layers formed over a semiconductor substrate and subsequently filled with a metal to provide for electrical connection to various diffusion regions in the substrate. In typical contact processes, these openings are etched in the dielectric layer. However, since the contacts need to be insulated from various semiconductor device structures and layers in a semiconductor wafer, contact openings must be etched taking into account where these device structures and layers have been formed as the etch may inadvertently expose these structures or layers. If the opening were to be filled with a metal, then, an electrical short will be created as the exposed structures or layers will be contacted by the filled metal.

To avoid creating electrical shorts, contact openings are typically spaced apart from underlying structures or layers. Since any misalignment in the etching mask may also expose underlying structures or layers during the etch and hence cause electrical shorting, the spacing between the desired openings and the underlying structures or layers must also compensate for such misalignment. This spacing requirement, however, limits the density of the device being fabricated as the contacts must be safely positioned away from underlying semiconductor device structures and layers. While the size of the contact openings may be made as small as possible not only to increase the device density but also to avoid electrical shorting, any reduction in the size of contact openings will be constrained by lithographic resolution limits in patterning the openings.

Self-aligned contact techniques have been developed to overcome the density and misalignment limitations of the above typical contact process. In a self-aligned contact process, an etch-stop layer must first be deposited over the wafer to encapsulate the tops and sides of various semiconductor device structures and layers prior to depositing the dielectric layer. Contact openings are then etched in the dielectric layer without risk of exposing the device structures or layers as the device structures and layers are protected by the encapsulating etch-stop layer. An anisotropic etch is then used to remove the etch-stop layer covering the region in the contact openings to be contacted. When the contact openings are filled with metal, then, the device structures and layers will be insulated from the metal by the etch-stop layer and by any insulative layer covering the structures or layers, thus avoiding electrical shorts. Self-aligned contact processes thus prove to be extremely useful in fabricating high-density devices without risk of electrical shorting. Indeed, electrical shorting is avoided despite any misalignment in the contact etch mask.

Despite the above advantages gained from self-aligned contact processes, they nevertheless suffer many drawbacks. For example, the contact opening etch demands a highly selective etch chemistry in order to reliably etch into the dielectric layer without etching the etch-stop layer. The high selectivity required for these etch chemistries is difficult to achieve. Another drawback of the etch technique is that unwanted polymers may be formed in the contact openings when stopping on the etch-stop layer. Cleaning such polymers from the contact openings only proves to make the contact process more difficult, particularly where the contact openings have high aspect ratios.

Furthermore, the device structures and layers in the wafer for typical self-aligned contact processes must be fully encapsulated in the etch-stop layer which includes forming a cap as well as sidewall spacers of the etch-stop material over each of the device structures and layers not only to fully protect the them from being exposed during the contact etch but also to insulate them from the contact metal. When a contact is formed between two closely spaced device structures, then, the area of contact to the underlying diffusion region becomes significantly reduced because of the etch-stop sidewall spacers. A reduction in contact area only serves to increase the effective resistance of the contact. These sidewall spacers also create a higher aspect ratio for the contact opening. Consequently, the available contact fill methods which may be used for self-aligned contacts becomes limited as less contact fill methods will have the step coverage required to create reliable contacts.

Thus, what is needed is a simpler self-aligned contact process for semiconductor device fabrication. What is also needed is a semiconductor device fabrication process for forming self-aligned contacts with decreased aspect ratios so as to provide larger contact areas and to reduce the step coverage required to create reliable contacts.

BRIEF SUMMARY OF THE INVENTION

The present invention advantageously simplifies typical self-aligned processes for semiconductor device fabrication by eliminating the need to use a highly selective etch chemistry to etch contact openings for self-aligned contacts. The present invention also provides for decreased aspect ratios for self-aligned contacts by eliminating the need to have etch-stop sidewall spacers, thus providing for larger contact areas and reducing the step coverage required to create reliable contacts.

In accordance with the present invention, a layer of a first material is formed over a semiconductor wafer. This first material layer is patterned to form a post over the wafer. A layer of a second material is formed over the wafer and around the post. The post is removed to form an opening in the second material layer. The first material may contain a photosensitive material, polysilicon, or other material. The opening in the second material layer may be filled with a third material. The second material may contain an insulative material while the third material may contain a conductive material. The first material may be patterned by etching the first material to form the post. Also, the second material may be planarized.

While the above advantages of the present invention have been described, other attendant advantages, objects, and uses of the present invention will become evident to one of ordinary skill in the art based on the following detailed description of the present invention with reference to the accompanying drawings.

BRIEF DESCRIPTION OF THE DRAWINGS

The present invention is illustrated by way of example and not limitation in the figures of the accompanying drawings in which like references indicate similar elements and in which.

DETAILED DESCRIPTION

A specific embodiment or embodiments in accordance with the present invention for disposable post processing for semiconductor device fabrication is described. In the following description, numerous specific details are set forth such as specific thicknesses, materials, processing sequences, deposition methods, semiconductor devices, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

Figure 1:
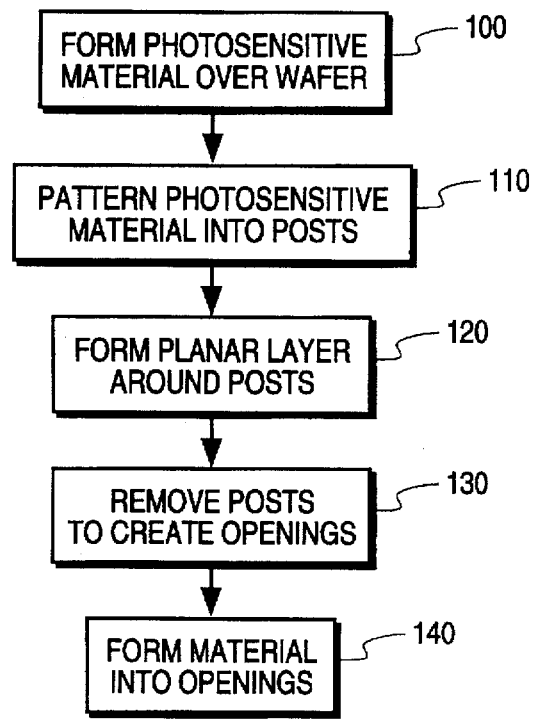
FIG. 1 illustrates in the form of a flow diagram an exemplary method for disposable post processing for semiconductor device fabrication in accordance with the present invention.
Figure 2A:
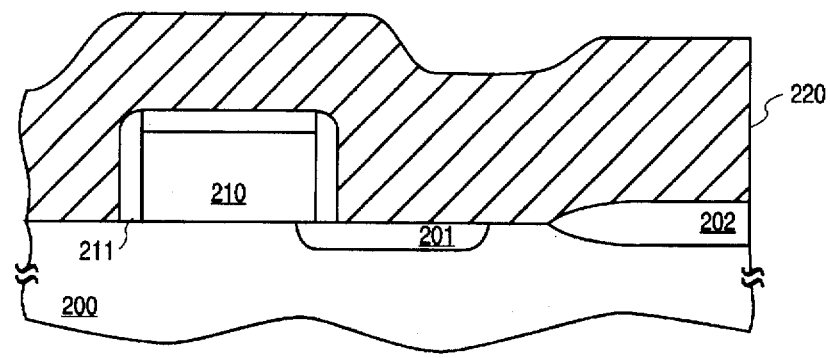
FIG. 2a illustrates a partial cross-sectional view of a semiconductor wafer after the formation of photosensitive material in accordance with the present invention.

FIG. 1 illustrates, in the form of a flow diagram, an exemplary method for disposable post processing for semiconductor device fabrication in accordance with the present invention. So as to better explain the method of FIG. 1, FIGS. 2a–2e will be used to illustrate the steps performed in the method of FIG. 1. For the disposable post processing of the semiconductor wafer partially illustrated in FIG. 2a–2e, a semiconductor substrate is provided, as illustrated in FIG. 2a by substrate 200. This substrate may be a silicon substrate, yet it is to be appreciated that a variety of other types of semiconductor substrates may be used, for example, depending upon one's specific design and/or functional requirements for the semiconductor device to be fabricated.

Regardless of the type of substrate, various processing steps may be performed prior to the disposable post process in accordance with the present invention. For example, various isolation structures and semiconductor devices may be formed over the substrate prior to the disposable post process in accordance with the present invention, as illustrated in FIG. 2a where diffusion region 201, field oxide region 202, and a MOS transistor including a polycrystalline silicon (polysilicon) gate 210 surrounded by an outer insulative silicon dioxide ($SiO_2$) layer 211 have been formed. It is to be understood, though, that the disposable post processing in accordance with the present invention may be used after other semiconductor structures and various levels of semiconductor structures have been formed over the substrate. For example, the disposable post processing in accordance with the present invention may be used at any contact or via level in order to form contact openings and/or vias. It is to be further understood that the specific processing steps performed may depend upon one's specific design and/or functional requirements for the semiconductor device to be fabricated.

In Step 100 of FIG. 1, a photosensitive material is formed over the semiconductor wafer, as illustrated in FIG. 2a where a layer of photosensitive material 220 has been formed over the semiconductor wafer. This photosensitive material may include, for example, photoresist or a photosensitive polyimide. The photosensitive material coated over the wafer preferably has a thickness which accounts for the highest topology of the wafer, any minimum insulation thickness needed over the wafer's topology, and optionally an etch-back margin as this photoresist may later be etched as will be discussed below. For example, in coating the photosensitive material over the wafer illustrated in FIG. 2a, the thickness of photosensitive material 220 is preferably as great as if not greater than the thickness of polysilicon gate 210 plus the thickness of oxide insulative layer 211 over polysilicon gate 210 plus the minimum insulation thickness needed over the MOS transistor formed by polysilicon gate 210 and oxide insulative layer 211 plus an optional etch-back margin to account for subsequent etching. While in this example photosensitive material 220 may be approximately 10,000 angstroms (A) in thickness, other thicknesses may also be used.

Figure 2B:
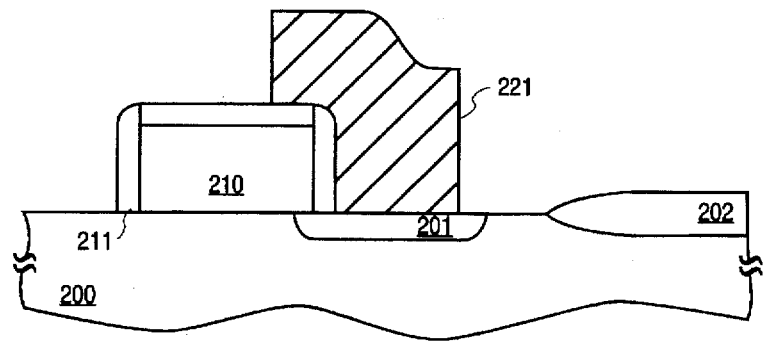
FIG. 2b illustrates a cross-sectional view of the semiconductor wafer of FIG. 2a where the photosensitive material has been patterned to create a post in accordance with the present invention.

In Step 110 of FIG. 1, then, this photosensitive material is patterned into posts, as illustrated in FIG. 2b where post 221 has been formed over substrate 200. The photosensitive material is patterned into posts by the exposure of radiation, for example ultra-violet light, through a mask and by the subsequent development of the photosensitive material. In one embodiment where the photosensitive material contains photoresist, a negative tone mask or an image reversal process using a positive tone mask may be used. Furthermore, the profile or cross-dimensions in various sections of the posts may be varied, for example, by controlling the exposure energy when exposing the photoresist through the mask. After being patterned these photoresist posts are preferably cured using a deep ultra-violet (UV) light exposure to harden the photoresist in the posts. Here, the polymers in the photoresist will become cross-linked during the deep UV cure so as to prevent the photoresist posts from later flowing or shrinking when exposed to elevated temperatures. As will be seen below, this may be needed in order for the posts to withstand subsequent processing steps.

The photosensitive material may be patterned such that the remaining photosensitive material after development defines the desired shapes and locations of openings for a layer to be formed over the surface of the wafer. In other words, the photosensitive material is patterned to define posts whose subsequent removal will create openings in an overlying layer formed over the wafer, for example, so that appropriate contacts and interconnects may be formed. It is to be appreciated that the posts may be of any shape and that the term post is not meant to be limited in meaning but rather includes, for example, any material used to define the location and shape of openings for a subsequently formed layer. For example, the term post encompasses long thin lines of material to form long thin openings.

In the illustration of FIG. 2b, photosensitive material 220 has been patterned to form post 221 over diffusion region 201 so as to later form a contact opening in an insulative layer to be formed over the surface of the wafer. With this contact opening, a contact may later be formed to provide for electrical connection to the underlying diffusion region 201 of substrate 200. It is to be appreciated that post 221 in this illustration is adjacent to and partially overlies the top of the MOS transistor.

Figure 2C:
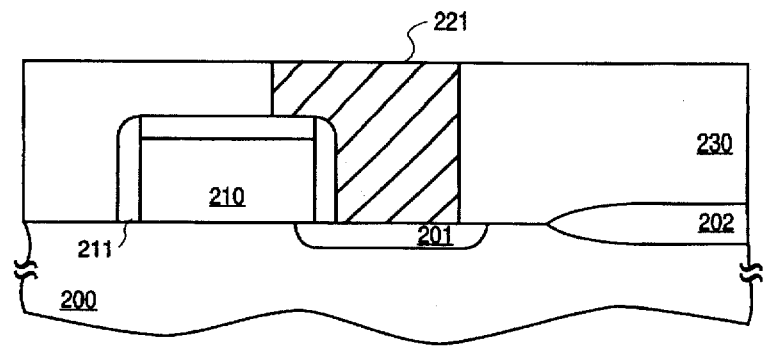
FIG. 2c illustrates a cross-sectional view of the semiconductor wafer of FIG. 2b where a planar layer has been formed around the post in accordance with the present invention.

Next in Step 120 of FIG. 1 a planar layer is formed around the posts over the substrate. This is illustrated in FIG. 2c where planar layer 230 has been formed around post 221 over substrate 200. This layer may be an insulative layer formed, for example, by forming a CVD silicon dioxide ($SiO_2$), silicon nitride ($Si_3N_4$), borophosphosilicate glass (BPSG), a low-temperature oxide (LTO), an oxynitride, a polyimide, or any other suitable dielectric material using suitable methods. Such an insulative layer may also be formed by using a combination of two or more layers of suitable dielectric materials. It is to be appreciated that the formation of the layer which is to surround the posts as well as any etch-back, polishing, and/or reflow of the overlying layer may involve heating the wafer to elevated temperatures. Accordingly, where the photosensitive material used to create the posts contains photoresist, the posts have been preferably hardened as discussed above using a deep UV cure so as to preserve the posts during such processing steps. Furthermore, the thickness of the layer surrounding the posts may be of any thickness depending, for example, on any electrical isolation needed between an underlying layer and a layer to be subsequently formed, any structural requirements, or the amount required to provide planarization as well as any other design or functional requirements.

In one embodiment, a spin-on glass (SOG) layer is first formed over the wafer and subsequently cured, for example, at approximately 350 degrees Celsius, as is required to withstand subsequent polishing. This first SOG layer is preferable since it is spun-on as a liquid and hence thoroughly fills and covers the surface of the wafer. Where photoresist posts are used, the first SOG layer is then post-baked, for example, at approximately 350 degrees Celsius or other temperatures so that the first SOG layer may withstand subsequent polishing. It is to be appreciated that for most photoresists which are used for the posts, this first SOG layer may not be finally cured as any elevated temperatures at or beyond approximately 400 degrees Celsius may cause considerable shrinkage of such photoresist posts and may make the photoresist posts more difficult to remove. A doped tetraethyl orthosilicate (TEOS) based silicon dioxide ($SiO_2$) layer is then deposited over the first SOG layer using a plasma-enhanced chemical vapor deposition (PECVD).

In another embodiment, a silicate SOG is used to form the planar layer. This silicate SOG layer is preferable since it is spun-on as a liquid and hence thoroughly fills and covers the surface of the wafer, leaving a planar surface. Where photoresist posts are used, this silicate SOG layer is then post-baked, for example, at approximately 250 degrees Celsius or other suitable temperatures to remove solvents prior to subsequent etching or at approximately 350 degrees Celsius or other suitable temperatures to withstand subsequent polishing as will be discussed below. It is to be appreciated that for most photoresists which are used for the posts, this first SOG layer may not be finally cured as any elevated temperatures at or beyond approximately 400 degrees Celsius may cause considerable shrinkage of such photoresist posts and may make the photoresist posts more difficult to remove.

Once the layer to surround the posts has been formed, the layer may be planarized using suitable methods, for example with a planarizing etch-back or polishing technique. In one embodiment polishing may be performed using a chemical mechanical polishing (CMP) technique where a polish slurry with a chemistry including a colloidal silica may be used. In planarizing the overlying layer which surrounds the posts, the posts are preferably also planarized and exposed at the surface of the water so as to facilitate their later removal from the planar layer. Where, however, the overlying layer surrounding the posts is, for example, spun-on or reflown, a planarizing etch-back or polishing may not be necessary as the surface of the overlying layer may already be planar. Preferably, any residue formed over the posts, though, is removed so as to facilitate their later removal from the overlying layer. For example, in the embodiment discussed above where a silicate SOG is used to form the overlying planar layer, a fluorine-based plasma oxide etch may be used to remove any residue from the SOG formation which remains over the top of the posts. In this manner, the wafer's surface remains planar while the posts may be exposed for later removal. Furthermore, it is to be appreciated that where the overlying layer is spun-on, reflown, or is otherwise planar, the formation of the photosensitive material used to create the posts may not need to account for the etch-back margin discussed above with regard to the thickness of photosensitive material.

Figure 2D:
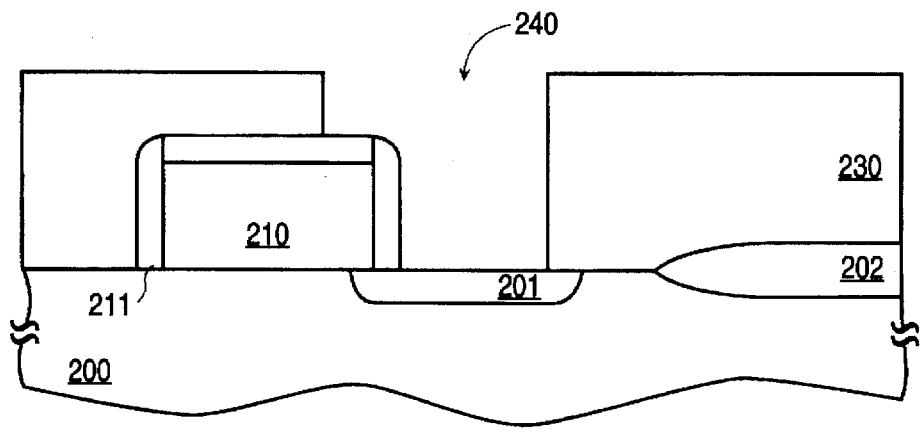
FIG. 2d illustrates a cross-sectional view of the semiconductor wafer of FIG. 2c where the post has been removed to create an opening in accordance with the present invention.

In Step 130 of FIG. 1, then, the posts are removed leaving respective openings throughout the planar layer, as illustrated in FIG. 2d where opening 240 has been formed in layer 230 by the removal of post 221. The technique used to remove the posts may depend on the material used for the posts as well as that used for the overlying planar layer. Preferably, the technique used to remove the posts causes little if any damage to the underlying surface, such as ion damage which may increase the resistance of the contacts formed from the openings. Furthermore, this technique preferably does not create any unwanted polymer formations which may have to be cleaned out of the openings. Where photoresist is used to create the posts, the posts may be, for example, ashed out using an oxygen plasma etch, etched out using a sulfuric acid, or dissolved using organic solvents. Such techniques will not damage the underlying substrate and will not form unwanted polymers in the openings.

It is to be appreciated here that where the posts contain photoresist, the planar layer may now be finally cured following removal of the posts. For example, in the embodiments discussed above where a SOG layer and a doped TEOS $SiO_2$ layer are used to form the planar layer and where SOG is used to form the planar layer, these layers may be finally cured at approximately 700 degrees Celsius, although other temperatures may be used.

Figure 2E:
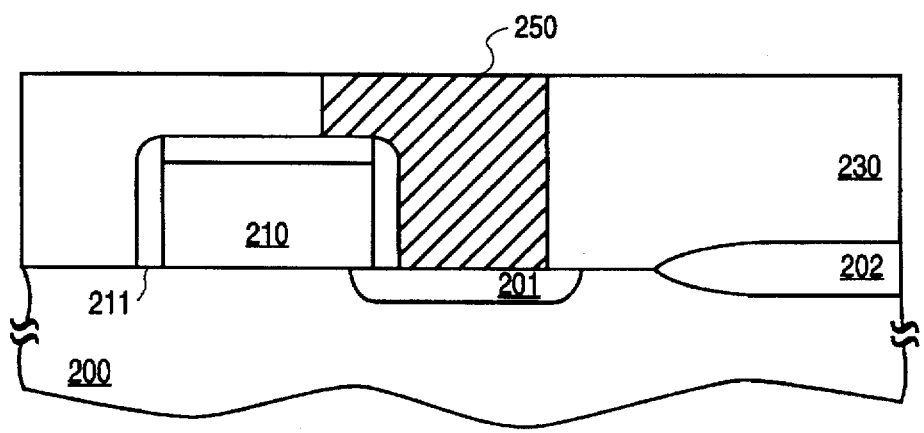
FIG. 2e illustrates a cross-sectional view of the semiconductor wafer of FIG. 2d where the opening has been filled in accordance with the present invention.

Lastly, in Step 140 of FIG. 1, a material is formed in the openings, as illustrated in FIG. 2e where opening 240 has been filled with material 250. For example, the openings may be filled to create appropriate contacts or interconnect lines using a blanket CVD tungsten (W) deposition and etch-back process to fill the openings. Other methods as well as other suitable conductive materials, for example aluminum (Al) and polysilicon, may also be used to form suitable contacts from the openings. It is to be appreciated that the openings do not have to be completely filled to create suitable contacts to the underlying regions but rather any suitable conductive material may be formed in the opening so long as electrical connection is provided to the underlying regions. For example, a layer of conductive material may be formed only over the underlying region to be contacted and along a portion of a sidewall of the opening to provide suitable contact to the underlying region.

Figure 3:
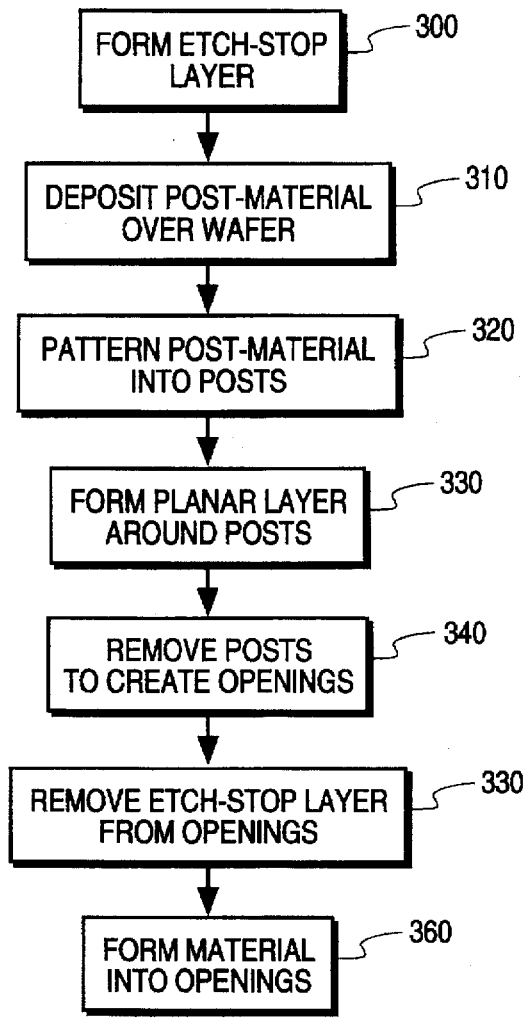
FIG. 3 illustrates in the form of a flow diagram another exemplary method for disposable post processing for semiconductor device fabrication in accordance with the present invention.
Figure 4A:
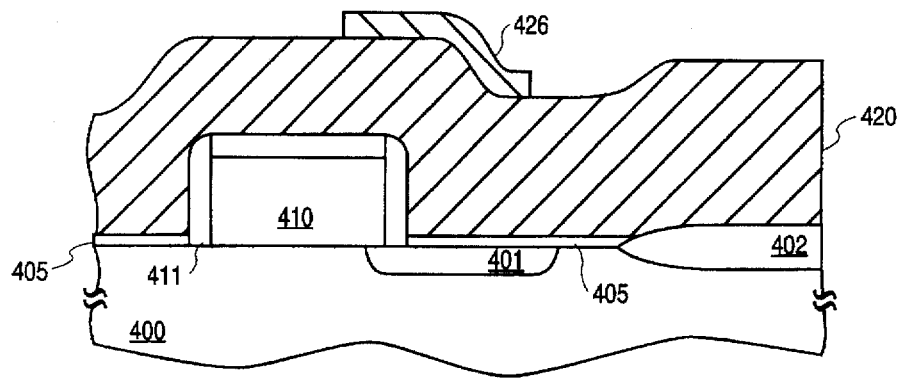
FIG. 4a illustrates a partial cross-sectional view of a semiconductor wafer after the formation of an etch-stop layer, post-material layer, optional hard mask layer, and a patterned photoresist layer in accordance with the present invention.

FIG. 3 illustrates, in the form of a flow diagram, another exemplary method for disposable post processing for semiconductor device fabrication in accordance with the present invention. So as to better explain the method of FIG. 3, FIGS. 4a–4e will be used to illustrate the steps performed in the method of FIG. 3. It is to be understood that the above discussion regarding substrate 200 in the method of FIG. 1 likewise applies for substrate 400, as illustrated in FIGS. 4a–4e, in the method of FIG. 3. Furthermore, the above discussion regarding the various processing steps which may be performed prior to the disposable post process in accordance with the present invention also applies for the method of FIG. 3. As illustrated in FIG. 4a, for example, a doped region 401, field oxide region 402, and a MOS transistor including a polycrystalline silicon (polysilicon) gate 410 surrounded by an outer insulative silicon dioxide ($SiO_2$) layer 411 may be formed over substrate 400.

In Step 300 of FIG. 3, an etch-stop layer is formed over the surface of the wafer, as illustrated in FIG. 4a where etch-stop layer 405 has been formed over substrate 400. In one embodiment this etch-stop layer is formed by growing in the range of approximately 30 Å to approximately 200 Å of silicon dioxide ($SiO_2$) over exposed silicon (Si) areas on the surface of the wafer. Alternatively, this oxide etch-stop layer may be deposited over the wafer. In either instance, other oxide thicknesses may be used. Furthermore, other materials, for example a CVD deposited silicon nitride ($Si_3N_4$), may be used in forming this etch-stop layer. It is to be appreciated that the material chosen for this etch-stop may depend on other factors for reasons which will follow.

In Step 310 of FIG. 3, a layer of material is formed over the semiconductor wafer, as illustrated in FIG. 4a where a layer of material 420 has been deposited over the semiconductor wafer. This material may include, for example, polysilicon, aluminum, or tungsten, and for this discussion is termed "post-material." Preferably, this post-material is chosen taking into account that it will later be etched. In this connection, an etch-technique may be used which etches the post-material at a higher rate than the etch-stop material, thus preventing the underlying surface from being damaged by the etch. In one embodiment where the etch-stop layer contains silicon dioxide ($SiO_2$) and a polysilicon layer is deposited over this etch-stop layer, a chlorine plasma etch which is selective to oxide may be used to etch the polysilicon. It is to be appreciated here that the methodology used to create polysilicon posts is similar to that typically used to create polysilicon gates over a substrate. The thickness of the post-material layer is preferably chosen taking into account the above noted factors regarding the thickness of photosensitive material to be used in the method of FIG. 1. Briefly, the layer of post-material formed over the wafer preferably has a thickness which accounts for the highest topology of the wafer, any minimum insulation thickness needed over the highest topology, and optionally an etch-back margin for reasons discussed below.

Figure 4B:
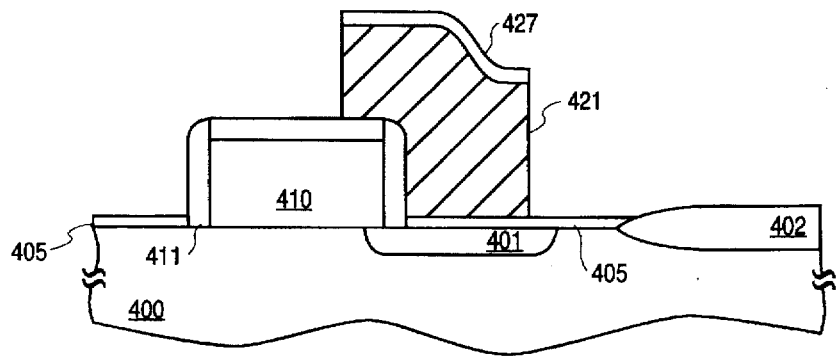
FIG. 4b illustrates a cross-sectional view of the semiconductor wafer of FIG. 4a where the post-material has been patterned to create a post in accordance with the present invention.

In Step 320 of FIG. 3, then, the post-material layer is patterned into posts, as illustrated in FIG. 4b where post 421 has been formed over substrate 400. Here, the post-material layer is etched, leaving posts over the surface of the wafer. In etching the post-material layer, an optional hard mask layer may be first formed over the post-material layer, as illustrated in FIG. 4a where hard mask layer 425 has been formed over layer 420. This optional hard mask layer may be formed, for example, by depositing silicon dioxide ($SiO_2$) having a thickness in the range of approximately 500 Å to approximately 1000 Å over the wafer. Other oxide thicknesses may also be used, however. A hard mask layer containing $SiO_2$ may alternatively be thermally grown over the surface of the wafer, for example, where the post-material contains polysilicon. A photoresist layer is then deposited over the hard mask layer and patterned such that photoresist overlies the regions on the wafer where the posts are to be formed, as illustrated in FIG. 4a where patterned photoresist layer 426 has been formed over hard mask layer 425. It is to be appreciated here that the above discussion regarding the shapes and locations of posts used in the method of FIG. 1 likewise applies for the posts formed in the method of FIG. 3. The hard mask layer may then be etched followed by the removal of patterned photoresist layer 426. The post-material is then etched using the remaining hard mask, as illustrated in FIG. 4b as hard mask 427, to create the posts. Where the hard mask contains $SiO_2$, the post-material contains polysilicon, and the etch-stop layer contains $SiO_2$, a chlorine plasma etch selective to $SiO_2$ may be used to etch the polysilicon while stopping on the underlying oxide etch-stop layer. Any resulting etch residue may be removed following this etch, for example using a standard wet clean, such as a sulfuric clean, or dry clean.

It is to be appreciated that other materials may be used in forming the hard mask. For example, silicon nitride ($Si_3N_4$) may be used. It is to be understood though that the material chosen for the hard mask may be interdependent with the material for the etch-stop layer, the type of post-material, and the selective etch chemistry to be used in patterning the posts. It is also to be appreciated that the use of the hard mask discussed above is optional whereas the photoresist itself may be directly coated over the post-material, patterned, and used in etching the post-material to create the posts.

Figure 4C:
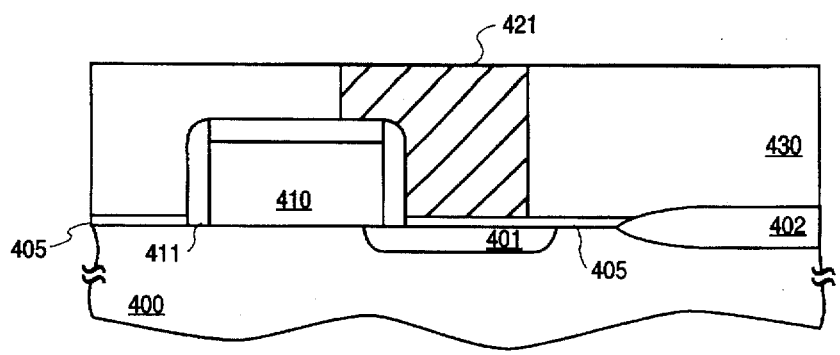
FIG. 4c illustrates a cross-sectional view of the semiconductor wafer of FIG. 4b where a planar layer has been formed around the post in accordance with the present invention.

Next, in Step 330 of FIG. 3, a planar layer is formed around the posts over the substrate. This is illustrated in FIG. 4c where planar layer 430 has been formed around post 421 over substrate 400. It is to be appreciated that the above methods and materials used to form the planar layer in the method of FIG. 1 may similarly be used in the method of FIG. 3 such that a planar layer surrounding the posts is formed and the posts are exposed at the surface of the wafer. It is also to be appreciated that where the posts contain polysilicon, a SOG layer used to form the overlying planar layer may be fully cured prior to removal of the posts. This is to be contrasted with the above discussion where SOG layers could not be finally cured as elevated temperatures may cause considerable shrinkage of photoresist posts.

In Step 340 of FIG. 3, then, the posts are removed leaving respective openings throughout the planar insulative layer. The technique used to remove the posts may depend on the specific material used to create the posts, the overlying planar layer surrounding the posts, and the etch-stop layer. Where the post-material contains polysilicon, the overlying layer contains $SiO_2$, and the etch-stop layer contains $SiO_2$, for example, a chlorine plasma etch which is selective to oxide may be used to remove the posts.

Figure 4D:
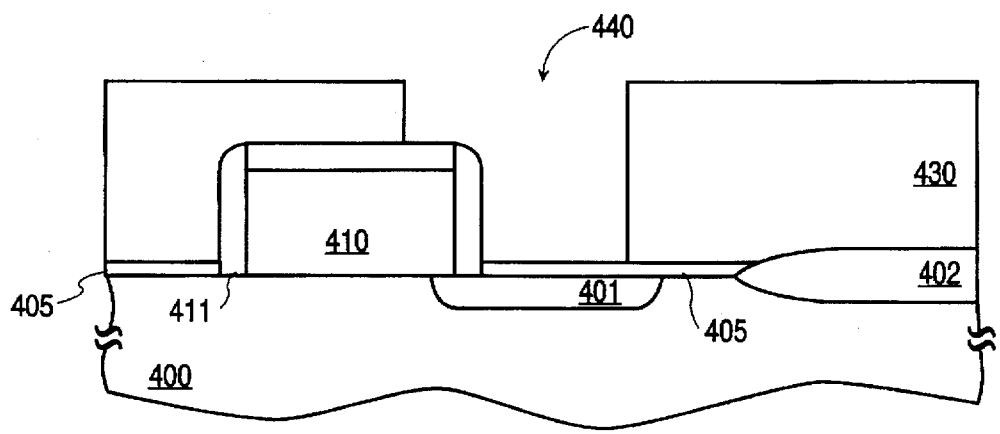
FIG. 4d illustrates a cross-sectional view of the semiconductor wafer of FIG. 4c where the post has been removed to create an opening in accordance with the present invention.

Once the post-material has been removed, the etch-stop layer in the openings is removed in Step 350 of FIG. 3, as illustrated in FIG. 4d where opening 440 has been formed in layer 430 by the removal of post 421 and the etch-stop material from the opening. The technique used to remove the etch-stop material in the openings may depend on the material used for the etch-stop layer. Preferably, the technique used to remove the etch-stop layer causes little if any damage to the underlying surface or form any unwanted polymers which may have to be cleaned out of the openings. In an embodiment where the etch-stop layer contains $SiO_2$, this oxide may be etched out from the opening using a short zero-polymer, non-selective etch which causes little if any ion damage to the underlying surface and which does not form unwanted polymers that would have to cleaned from the openings. Alternatively, this oxide may be dipped-out from the openings using a pre-dip technique just prior to any filling of the openings.

Figure 4E:
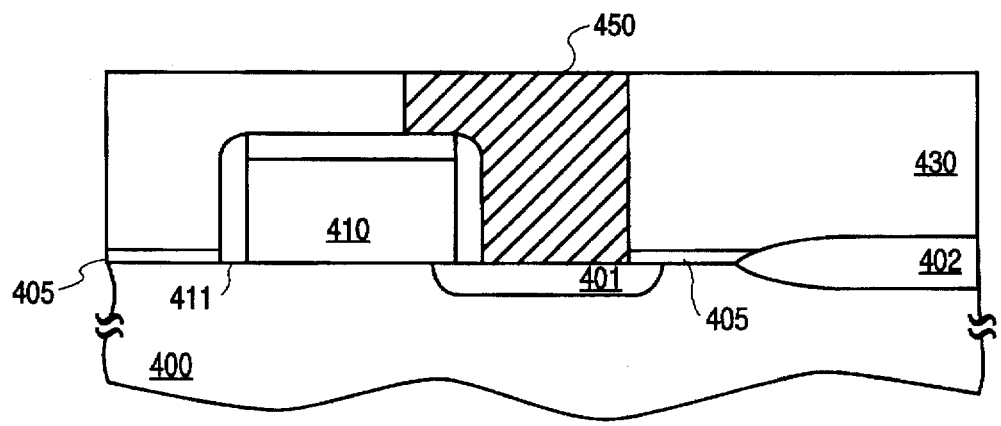
FIG. 4e illustrates a cross-sectional view of the semiconductor wafer of FIG. 4d where the opening has been filled in accordance with the present invention.

Lastly, in Step 360 of FIG. 3, a material is formed in the openings, as illustrated in FIG. 4e where opening 440 has been filled with material 450. It is to be appreciated that the above discussion regarding the formation of contacts from the openings in the method of FIG. 1 likewise applies for the method of FIG. 3.

Accordingly, the disposable post process in accordance with the present invention may be used to create self-aligned contacts, as illustrated in FIGS. 2e and 4e. Indeed, in these illustrations openings 240 and 440 have been formed adjacent to and partially over insulative oxide layer 211 and 411 without exposing polysilicon gate 210 and 410, respectively. Openings 240 and 440 may then be safely used to form suitable contacts without risk of electrical shorting. The disposable post process in accordance with the present invention will thus prove to be valuable in fabricating future, high density very large scale (VLSI) and ultra large scale integrated (ULSI) circuits as contacts may be safely formed directly adjacent to semiconductor devices.

In contrast with prior art self-aligned contact processes, it is to be appreciated that the disposable post process in accordance with the present invention does not require the highly selective etch chemistry used in prior art self-aligned contact processes in order to etch contact openings. Furthermore, unwanted polymers which are formed in contact openings as a result of using a highly selective contact opening etch which stops on an etch-stop layer are avoided. In this respect, the disposable post process in accordance with the present invention greatly simplifies prior art self-aligned contact processes. The disposable post process in accordance with the present invention also provides for decreased aspect ratios for contact openings as the etch-stop sidewall spacers which were required in prior art self-aligned contact processes are no longer needed in forming the contact opening. Accordingly, contact areas between two closely spaced device structures are now larger, thus reducing the effective resistance of the contacts. Furthermore, this decreased aspect ratio reduces the step coverage required to create reliable contacts from the openings.

While the above description illustrates the formation of self-aligned contacts using the disposable post process in accordance with the present invention as aligning a contact to a MOS transistor, it is to be appreciated that contacts may also be aligned to various other semiconductor structures using the disposable post process in accordance with the present invention. For example, contacts formed in accordance with the present invention may also be aligned to insulated wiring, other types of insulated gates, as well as field oxide regions without causing electrical shorting. In the field oxide region example, prior art self-alignment contact processes required an etch-stop layer to prevent pull-back of the Bird's beak during the contact opening etch. That is, an etch-stop layer formed over a field oxide region would prevent the contact opening etch from pulling-up the edge of the field oxide region and exposing the underlying substrate to the contact metal, creating an electrical short. As with other prior art self-aligned contact processes, this too required a highly selective etch chemistry to etch the contact openings and the removal of the etch-stop layer from the contact openings. The disposable post process in accordance with the present invention, however, does not require the highly selective etch chemistry for the contact opening etch or the removal of an etch-stop layer from the contact opening, and therefore provides for a simpler process to align a contact to a field oxide region.

It is also to be appreciated that the planar surface topography created using the disposable post process in accordance with the present invention, as illustrated in FIGS. 2e and 4e, aids in the fabrication of subsequent layers of a multilevel integrated circuit. Since surface topography affects the accuracy of lithography definition, it is to be appreciated that the resulting planar surface topography will prove to be valuable in fabricating future, high density very large scale (VLSI) and ultra large scale integrated (ULSI) circuits. Indeed, various conductive lines may later be patterned over contact filling 250 and 450 as well as other contact fillings to form appropriate interconnections as desired in fabricating, for example, various functional Bipolar, BiCMOS, and CMOS integrated circuits such as memories and microprocessors.

Furthermore, while the description of the method for disposable post processing for the semiconductor wafer of FIGS. 2a–2e and FIGS. 4a–4e is illustrated as forming only one post in order to form one opening in a layer over a substrate, it is to be understood that this depiction is merely illustrative for a clearer understanding of the present invention. It is to be understood that the views of FIGS. 2a–2e and 4a–4e are merely partial views of a larger semiconductor substrate and that other posts and openings may be formed using this same substrate. It is also to be understood that the present invention may be practiced in forming these other posts and openings and may also be practiced in forming only some of the other openings formed over the substrate.

As discussed above, the posts formed in accordance with the present invention may be used to form various shaped openings throughout an overlying layer surrounding the posts, for example to create contact and/or via openings in an insulative layer. While the above description for disposable post processing in accordance with the present invention is illustrated in FIGS. 2a–2e and 4a–4e as forming a contact opening, it is to be appreciated that the present invention may also be used to form openings for other purposes, for example, to form single-level interconnect structures in connecting two or more underlying regions in a substrate as well as in connecting two or more contacts using the disposable post process in accordance with the present invention. FIGS. 5a–5e illustrate how the disposable post processing may be performed to create such interconnect structures as follows.

Figure 5A:
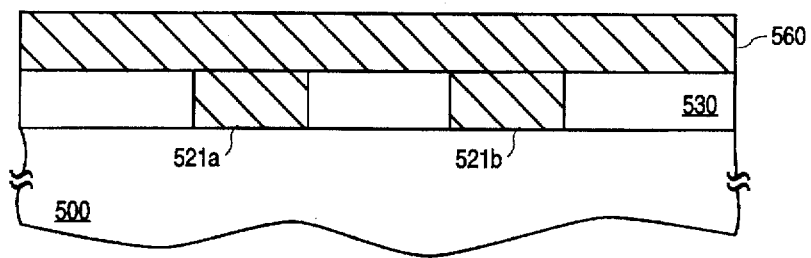
FIG. 5a illustrates a partial cross-sectional view of a semiconductor wafer having a planar layer with two posts where a material has been formed over the planar layer in accordance with the present invention.
Figure 5B:
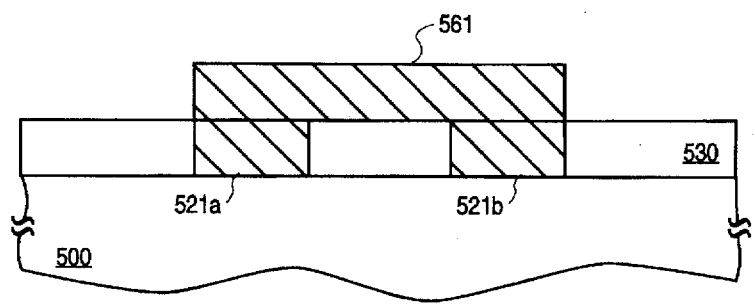
FIG. 5b illustrates a cross-sectional view of the semiconductor wafer of FIG. 5a where the material has been patterned to create a post in accordance with the present invention.

As illustrated in FIG. 5a, two posts 521a and 521b have been formed in an overlying planar layer 530 over substrate 500. It is to be appreciated that this planar layer 530 which contains posts 521a and 521b may be formed in accordance with either the method of FIG. 1 or the method of FIG. 3. A layer of material 560 is formed over planar layer 530 in order to form a post so as to provide for an interconnect between two contacts which will be formed using posts 521a and 521b. This disposable post process which is performed over layer 530 may also be performed in accordance with either the method of FIG. 1 or the method of FIG. 3. As illustrated in FIG. 5b, layer 560 is patterned to form post 561. It is to be appreciated that post 561 at least partially overlies each post 521a and 521b and extends between posts 521a and 521b. It is also to be appreciated that if post 561 were patterned in accordance with the method of FIG. 3, then the underlying layer 530 may be used as an etch-stop in patterning material 560 to form post 561. For example, the underlying layer may contain an insulative oxide while material 560 may contain polysilicon.

Figure 5C:
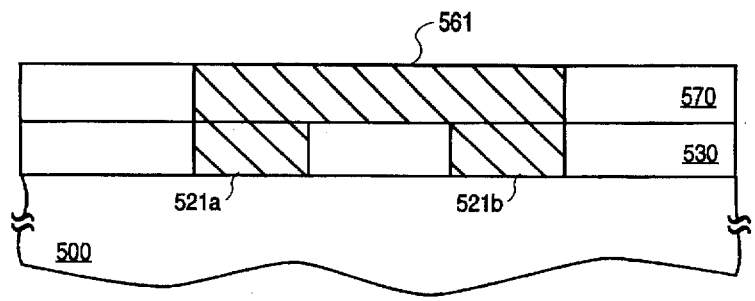
FIG. 5c illustrates a cross-sectional view of the semiconductor wafer of FIG. 5b where a planar layer has been formed around the post in accordance with the present invention.
Figure 5D:
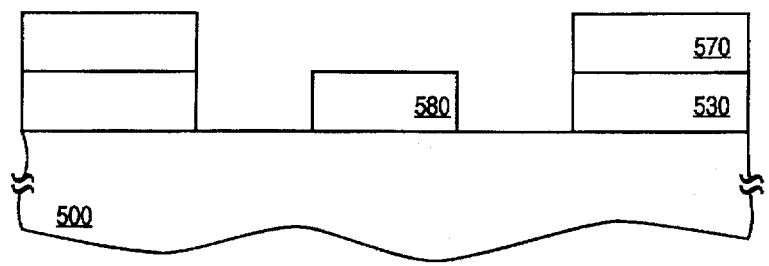
FIG. 5d illustrates a cross-sectional view of the semiconductor wafer of FIG. 5c where the post has been removed to create an opening in accordance with the present invention.
Figure 5E:
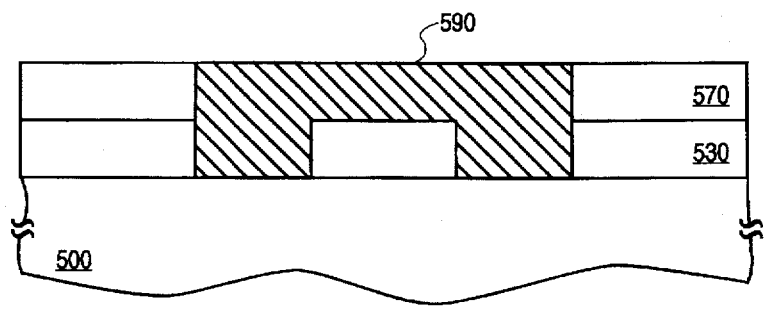
FIG. 5e illustrates a cross-sectional view of the semiconductor wafer of FIG. 5d where the opening has been filled in accordance with the present invention.

A planar layer 570 is then formed over layer 530, surrounding post 561 as illustrated in FIG. 5c. The material used to form post 561 as well as posts 521a and 521b is subsequently removed to create opening 580 in the surface of the wafer. It is to be appreciated that the material used to create post 561 may or may not be the same as that used to create posts 521a and 521b. Where the materials are the same, though, all the posts may be and preferably are removed in a single process. After the posts have been removed, opening 580 may be filled to create an appropriate interconnect structure 590.

Figure 6:
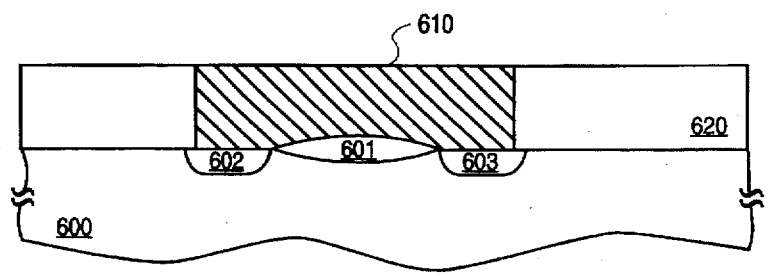
FIG. 6 illustrates a partial cross-sectional view of a semiconductor wafer where an interconnect structure has been formed in accordance with the present invention.

It is to be appreciated that the present invention may also be used to for an interconnect structure in connecting two or more underlying regions in a substrate, as illustrated in FIG. 6 where a planar layer 620 having interconnect structure 610 has been formed to connect regions 602 and 603 of substrate 600. While regions 602 and 603 are illustrated in FIG. 6 as being separated by field oxide region 601, it is to be understood that regions 602 and 603 may be separated by other semiconductor structures, for example, a polysilicon gate. The present invention may also be used to form an interconnect structure between two regions of a substrate which are directly adjacent to one another. Furthermore, the present invention may be used to form an interconnect structure to connect two or more contacts formed in an underlying layer. Such contacts may or may not have been formed using the present invention.

It is also to be appreciated that while the above the above description for the formation of an interconnect structure is illustrated as forming only one post in order to provide for an interconnection between only two regions, it is to be understood that this depiction is merely illustrative for a clearer understanding of the present invention and that the disposable post process in accordance with the present invention may be used to create interconnect structures among more than two regions. It is to be understood that the views of FIGS. 5a–5e and 6 are merely partial views of a larger semiconductor substrate and that other interconnect posts and openings may be formed using these same substrates. It is also to be understood that the present invention may be practiced in forming these other posts and openings and may also be practiced in forming only some of the other openings formed over the substrate.

A disposable post process in accordance with the present invention has thus been described. As described above, the disposable post process in accordance with the present invention may be used to create self-aligned contacts. In this regard, the present invention advantageously simplifies typical self-aligned processes for semiconductor device fabrication by eliminating the need to use a highly selective etch chemistry to etch contact openings for self-aligned contacts. The present invention also provides for decreased aspect ratios for self-aligned contacts by eliminating the need to have etch-stop sidewall spacers, thus providing for larger contact areas and reducing the step coverage required to create reliable contacts from the openings. It is to be understood, however, that the present invention may also be practiced in other manners for fabrication various semiconductor devices. For example, the present invention may be used to form other contacts which are not aligned to various structures, vias, or interconnect structures.

While the present invention has been described above as for forming openings in insulative layers to provide for appropriate conductive connections for various regions in a semiconductor wafer, it is to be appreciated that the disposable post process in accordance with the present invention is not limited in use to forming openings in insulative or dielectric layers. Indeed, the present invention may be used to form openings in other types of layers, for example metal layers or other conductive layers, in fabricating various semiconductor devices.

While the detailed description in accordance with the present invention has been set forth above with regard to the best mode and preferred embodiment or embodiments contemplated by the inventor, it is to be appreciated that the present invention is not limited to the above embodiment or embodiments and that various modifications may be made to the above embodiment or embodiments without departing from the broader spirit or scope of the present invention as defined in the following claims. The specific embodiment or embodiments are, accordingly, to be regarded in an illustrative rather than a restrictive sense.

What is claimed is:

1. A method for disposable post processing over a semiconductor wafer, comprising the steps of:
    (a) forming over the semiconductor wafer a first layer having a first material;
    (b) patterning the first layer to form a first post and a second post;
    (c) forming over the semiconductor wafer and around the first and second posts a second layer having an insulative material;

(d) forming over the second layer a third layer having a third material;

(e) patterning the third layer to form a third post, wherein the third post overlies at least a portion of the first post and at least a portion of the second post;

(f) forming over the semiconductor wafer and around the third post a fourth layer having an insulative material;

(g) removing the first, second, and third posts after the forming step (f) to form an opening in the second and fourth layers; and (h) forming a conductive material in the opening.

2. The method of claim 1, wherein the first material comprises a photosensitive material.

3. The method of claim 1, wherein the third material comprises a photosensitive material.

4. The method of claim 1, wherein the first material comprises polysilicon.

5. The method of claim 1, wherein the third material comprises polysilicon.

6. The method of claim 1, wherein the forming step (c) comprises the step of planarizing the second layer.

7. The method of claim 6, wherein the planarizing step comprises the step of polishing the second layer using a chemical mechanical polishing technique, wherein at least a portion of the first post and at least a portion of the second post are exposed in the second layer.

8. The method of claim 1, wherein the forming step (f) comprises the step of planarizing the fourth layer.

9. The method of claim 1, wherein the patterning step (b) comprises the step of etching the first layer to form the first post and the second post.

10. The method of claim 1, wherein the patterning step (e) comprises the step of etching the third layer to form the third post.

11. A method for disposable post processing over a semiconductor wafer, comprising the steps of:

(a) forming a first post and a second post of a first material over the semiconductor wafer;

(b) forming over the semiconductor wafer and around the first and second posts a second layer having an insulative material;

(c) forming over the second layer a third layer having a third material;

(d) patterning the third layer to form a third post, wherein the third post overlies at least a portion of the first post and at least a portion of the second post;

(e) forming over the semiconductor wafer and around the third post a fourth layer having an insulative material;

(f) removing the first, second, and third posts after the forming step (e) to form an opening in the second and fourth layers; and (g) forming a conductive material in the opening.

12. The method of claim 11, wherein the first material comprises a photosensitive material.

13. The method of claim 11, wherein the third material comprises a photosensitive material.

14. The method of claim 11, wherein the first material comprises polysilicon.

15. The method of claim 11, wherein the third material comprises polysilicon.

16. The method of claim 11, wherein the forming step (b) comprises the step of planarizing the second layer.

17. The method of claim 16, wherein the planarizing step comprises the step of polishing the second layer using a chemical mechanical polishing technique, wherein at least a portion of the first post and at least a portion of the second post are exposed in the second layer.

18. The method of claim 11, wherein the forming step (e) comprises the step of planarizing the fourth layer.

19. The method of claim 11, wherein the forming step (a) comprises the step of etching the first layer to form the first post and the second post.

20. The method of claim 11, wherein the patterning step (d) comprises the step of etching the third layer to form the third post.

* * * * *